United States Patent Office 3,202,513
Patented Aug. 24, 1965

3,202,513

PHOTOPOLYMERIZABLE COMPOSITIONS CONTAINING STANNOUS SALTS OF ACIDS AND ELEMENTS PRODUCED THEREFROM

Glen Anthony Thommes, Red Bank, N.J., assignor to E. I. du Pont de Nemours and Company, Wilmington, Del., a corporation of Delaware No Drawing. Filed June 3, 1960, Ser. No. 33,638
15 Claims. (Cl. 96—115)

This invention relates to new photopolymerizable compositions and to improved addition polymerizable elements, e.g., sheets and plates, prepared from the photopolymerizable compositions. More particularly, it relates to such compositions and elements which have good stability upon storage with respect to the influence of oxygen. Still more particularly it relates to such compositions which have an increased rate of polymerization.

Photopolymerizable compositions and elements, e.g., those useful for making printing reliefs are described in Plambeck U.S. Patents 2,760,863 and 2,791,504 and Martin and Barney, No. 2,927,022, patented March 1, 1960. The photopolymerizable elements have on a suitable support a photopolymerizable layer comprising a polymeric binder, an addition polymerization initiator activatable by actinic light and an addition polymerizable ethylenically unsaturated compound capable of forming a high polymer by photoinitiated addition polymerization in the presence of such an initiator. Certain of these photopolymerizable compositions, particularly those which contain esters of acrylic acid, while extremely useful in the preparation of relief printing elements, upon storage, become less sensitive to actinic light due to the diffusion of oxygen from the air into the photopolymerizable layer. After processing, the relief image areas of such oxygen desensitized photopolymerizable elements are undercut, are poorly anchored to the support and are of poor quality. There are means of removing or preventing oxygen from saturating and desensitizing the photopolymerizable layer of the printing element. One example is storing or treating the element in an essentially oxygen free atmosphere of an inert gas. This technique gives satisfactory results but requires special equipment and is time-consuming.

An object of this invention is to provide improved photopolymerizable compositions useful for the preparation of relief printing elements. Another object is to provide such compositions which do not become desensitized, upon extended storage, by the oxygen in the air. A further object is to provide photopolymerizable printing elements, which after storage in air for up to 3 months, have a polymerization rate at least equivalent to that of photopolymerizable elements which are essentially oxygen free. Still further objects will be apparent from the following description.

The photopolymerizable compositions of this invention comprise:

(1) 10 to 60 parts by weight of a normally non-gaseous, ethylenically unsaturated compound containing 1 to 4 terminal ethylenic groups having a molecular weight less than 1500, a boiling point above 100° C. at normal atmospheric pressure and being capable of forming a high polymer by photoinitiated addition polymerization.

(2) 0.001 to 10 parts by weight of an addition polymerization initiator activatable by actinic light, normally non-reactive (e.g., not reducible) with stannous chloride and inactive thermally below 85° C. and preferably below 185° C.

(3) 40 to 90 parts by weight of a compatible, coherent film-forming, macromolecular organic polymer having a molecular weight greater than 10,000.

(4) 0.6 to 3.0 parts by weight of a stannous salt of an acid soluble in the components (1) and (2), and, if desired (5) 0.001 to 2 parts by weight of an addition polymerization inhibitor.

The photopolymerizable elements of the invention comprise a solid layer of the photopolymerizable composition described above on a suitable support, which may be a flexible or stiff sheet or plate, planar or curved and which may have an intermediate anchor or sublayer or layers on its upper surface. The element can also contain antihalation material in light absorbing relationship with the relief height-forming stratum of the photopolymerizable layer. The anti-halation material is usually disposed below said stratum and preferably is in the anchor layer or in a layer coated on the anchor layer.

The photopolymerizable elements can be made by means of conventional coating and extruding apparatus and processes. Suitable such processes and apparatus are described in the patents listed above and in Munger U.S. Patent 2,923,673.

The photopolymerizable element can be exposed through a process transparency to actinic light, and the unexposed areas removed by washing in a suitable solvent solution. Good quality relief images with no plugging of images nor undercutting are obtained.

In a particularly preferred embodiment of the invention, a photopolymerizable composition is prepared comprising (1) cellulose acetate succinate, 67 parts by weight, (2) a polyethylene glycol diacrylate having an average molecular weight of the diol precursor of 200 to 600, 33 parts by weight, (3) anthraquinone, 0.03 part by weight, (4) p-methoxyphenol, 0.03 part by weight, and (5) stannous chloride, 2.0 parts by weight, is formed into a layer, 40 mils in thickness, and is bonded on a base support, e.g., aluminum, after the manner described in Example 3 of assignee's Burg application Serial No. 750,868, filed July 25, 1958. The photopolymerizable element is stored in air for a lengthy period of time, e.g., 3 months, is exposed to 1.75 watts of actinic radiation per square inch for 6 seconds or more through a process transparency to actinic light, and the unexposed areas subsequently removed by washing in a dilute aqueous solution of NaOH, e.g., 0.02 to 0.08% by weight. The relief printing element has good quality relief images with no undercutting or plugging of the images.

The invention will be further illustrated by, but is not intended to be limited to the following examples:

*Example I*

A photopolymerizable composition was prepared by milling on a rubber mill at 150° C. for 30 minutes 360 g. of cellulose acetate succinate, 180 g. of triethylene glycol diacrylate (containing 0.18 g. of p-methoxyphenol, 0.18 g. of anthraquinone and 0.18 g. of mucochloric acid), and 3 g. of stannous chloride dihydrate. The composition was formed into three sheets, 40 mils thick, by pressing at 140° C. in a hydraulic press. The sheets were then laminated to aluminum sheet supports, 12 mils thick, by the method described in Example 3 of assignee's Burg application, Serial No. 750,868, filed July 25, 1958, U.S. Patent 3,036,913, May 29, 1962. An additional element was prepared by the procedure described above in this example except that the stannous chloride dihydrate was omitted from the photopolymerizable composition. The three elements containing stannous chloride dihydrate were exposed to air for one month, two months and three months respectively. The elements, after the indicated storage periods, were placed beneath an 1,800-watt high-pressure mercury-arc lamp and exposed through a line process negative to 1.75 watts of actinic radiation per square inch for 6 seconds. The unexposed polymer was removed by spray washing for 8 minutes using a 0.08 N aqueous solution of NaOH. Three satisfactory printing elements were obtained with a relief image of good quality and with no plugging of the characters. Good reproductions of the original image were obtained when the elements were used for printing on a rotary press. The photopolymerizable element made from the photopolymerizable composition containing no stannous chloride dihydrate was stored in air for 1 day and exposed to actinic light through a process negative by the method described above in this example. The element was exposed to 1.75 watts of actinic radiation per square inch for 16 seconds, and the unexposed areas were washed out by spray washing for 8 minutes with an 0.08 N aqueous solution of NaOH. The printing element had severely undercut printing characters which broke off when used for printing on a rotary press.

*Example II*

Samples of photopolymerizable compositions were prepared by placing 5 g. of polyethylene glycol diacrylate (having an average molecular weight of the diol precursor of 300) containing 0.005 g. of p-methoxyphenol in 3 dram glass bottles. To each bottle sample was added the amount of addition polymerizable initiator based on the weight of the monomeric compound indicated below, and the photopolymerizable samples were then exposed with a Hanovia 125-watt mercury vapor lamp positioned 3 inches from the sample bottle. The time required to polymerize each sample was determined. The time to polymerize is defined as the irradiation time required for the entire bulk of the sample to become non-fluid, i.e., the bottle can be inverted without the sample flowing. The following results were obtained for the initiator sytem under conditions as follows:

| | Time to polymerize, sec. |
|---|---|
| (A) Anthraquinone (0.1% by weight): | |
| In air | 240 |
| $N_2$ flushed for 5 min. | 10 |
| $SnCl_2 \cdot 2H_2O$ (1% by wt.) in air | 10 |
| (B) Benzophenone (0.1% by weight): | |
| In air | 720 |
| $N_2$ flushed for 5 min. | 15 to 20 |
| $SnCl_2 \cdot 2H_2O$ (1% by wt.) in air | 10 to 15 |
| (C) Benzoin (0.1% by weight): | |
| In air | 960 |
| $N_2$ flushed for 5 min. | 12 |
| $SnCl_2 \cdot 2H_2O$ (1% by wt.) in air | 7 |
| (D) Benzoin methyl ether (0.1% by weight): | |
| In air | 270 |
| $N_2$ flushed for 5 min. | 5 |
| $SnCl_2 \cdot 2H_2O$ (1% by wt.) in air | 1–5 |
| (E) Uranyl nitrate (1.0% by weight): | |
| In air | 180 |
| $N_2$ flushed for 5 min. | 8 to 10 |
| $SnCl_2 \cdot 2H_2O$ (1% by wt.) in air | 8 to 10 |
| (F) No photoinitiator: | |
| $SnCl_2 \cdot 2H_2O$ (in air) | 35 |
| $SnCl_2 \cdot 2H_2O$ $N_2$ flushed for 5 min. | 35 |
| (G) No photoinitiator: | |
| In air | 2700 |
| $N_2$ flushed for 5 min. | 60 |

This example illustrates that by adding stannous chloride, i.e., 1 percent by weight, to a photopolymerizable monomer photoinitiator system the new photopolymerizable composition formed can be polymerized at least as fast as a photopolymerizable composition from which the oxygen has been essentially removed.

*Example III*

A photopolymerizable composition was prepared by mixing 5 g. of polyethylene glycol diacrylate described in Example II, 0.005 g. of anthraquinone and 0.05 g. of $Sn(BF_4)_2$. The mixture was placed in a glass bottle and exposed with a Hanovia 125-watt mercury vapor arc lamp as described in Example II. Total polymerization, as defined in Example I, was obtained in 10 seconds. The procedure of this example was repeated except that the $Sn(BF_4)_2$ was omitted from the photopolymerizable composition. Photopolymerization of the control was noted in 240 seconds.

*Example IV*

A photopolymerizable composition was prepared from 60 g. of cellulose acetate, 40 g. of triethylene glycol diacrylate, 0.1 g. of anthraquinone, 0.1 g. of p-methoxyphenol and 1.5 g. of stannous chloride dihydrate and was formed into a photopolymerizable layer 40 mils thick as described in Example I. The photopolymerizable sheet was laminated to a 12-mil thick aluminum sheet by the procedure described in Example I. After exposing the element to air for 48 hours, the element was placed beneath the actinic light source described in Example I and exposed through a line process negative to 1.75 watts of actinic radiation per square inch for 10 seconds. The unexposed areas were removed by spray-washing the element in acetone for 10 minutes. A satisfactory printing element was obtained which gave good reproductions of the original image when used for printing on a rotary press. The procedure of this example was repeated except that the $SnCl_2$ was omitted from the photopolymerizable composition. Upon washout, the image areas of the printing element were severely undercut.

*Example V*

A photopolymerizable composition was prepared from 30 g. of N-methoxymethyl polyhexamethylene adipamide, 15 g. of glycol dimethacrylate, 0.45 g. of anthraquinone, 0.03 g. of p-methoxyphenol and 1.2 g. of stannous chloride dihydrate and was formed into a sheet 40 mils in thickness as described in Example 4 of assignee's Saner U.S. application Serial No. 577,829, filed April 12, 1956, abandoned May 4, 1962. The photopolymerizable sheet was laminated to a 12-mil sheet of aluminum at 100° C. for 2 to 3 minutes as described in Example 4 of the Saner application. After storing in air for 7 days, a line process negative was placed over the element, and the element was exposed to 1.75 watts of actinic radiation per square inch for 20 seconds as described in Example I. The unexposed areas were removed by washing the element in a 70% aqueous ethanol solution at 40 to 45° C. Good printing reliefs were obtained.

While it is preferred that the photopolymerizable composition be a mixture of cellulose acetate succinate; triethylene glycol diacrylate or polyethylene glycol diacrylate with an average molecular weight of the diol precursor of 200 to 600; anthraquinone; and p-methoxyphenol, other photopolymerizable compositions of the type described in Plambeck U.S. Patent 2,760,863 might also be used to form solid photopolymerizable layers. Other compositions and organic polymer binders [constituent(3)] which can be used are described in the patents and U.S. applications of assignee as follows:

(1) N-methoxymethyl polyhexamethylene adipamide mixtures of Saner, Ser. No. 577,829, filed April 12, 1956 (abandoned);

(2) Linear polyamide compositions containing extralinear n-acrylyloxymethyl groups of Saner et al., Ser. No. 753,344, filed August 5, 1958, U.S. Patent 2,872,540, Feb. 21, 1961;

(3) Polyvinyl acetal compositions having the extra-linear vinylidene groups of Martin, Ser. No. 461,291, filed October 8, 1954, now U.S. Patent 2,929,710;

(4) Polyester, polyacetal or mixed polyester acetal mixtures of Martin U.S. Patent 2,892,716;

(5) Blends of selected organic-soluble, base-soluble cellulose derivatives with addition-polymerizable components and photoinitiators of Martin et al., Ser. No. 596,-766, filed July 9, 1956, now U.S. Patent 2,927,022;

(6) Polyvinyl alcohol derivatives of Martin U.S. Patent 2,902,365;

(7) 1,3-butadiene compositions of McGraw, Serial No. 664,459, filed June 10, 1957, now abandoned, and continuation-in-part Serial No. 833,928, filed August 17, 1959, U.S. Patent 3,024,180, March 6, 1962; and, in addition (8) Cellulose acetate (60 parts by weight); triethylene glycol diacrylate (40 parts by weight); anthraquinone (0.1 part by weight); and p-methoxyphenol (0.1 part by weight).

Suitable addition-polymerizable ethylenically unsaturated compounds, in addition to the preferred triethylene glycol diacrylate and polyethylene glycol diacrylates with an average molecular weight of the diol precursor of 200 to 600, include vinylidene monomers, particularly the vinyl monomers described in Plambeck U.S. Patent 2,791,-504, col. 17, line 62, to col. 18, line 16, acrylic or methacrylic acid esters of diethylene glycol, triethylene glycol and higher polyalkylene glycols, e.g., methoxytriethylene glycol acrylate, ethylene glycol dimethacrylate, diethylene glycol dimethacrylate, triethylene glycol dimethacrylate, diethylene glycol diacrylate, methoxytriethylene glycol methacrylate, di- and triethylene glycol acrylates, and methacrylates, the acrylates, diacrylates, methacrylates and dimethacrylates of tetraethylene glycol, dipropylene glycol, and polybutylene glycols. Still other useful compounds include the diacrylates and dimethacrylates of etherglycols which also contain a combined intrachain dibasic acid unit, e.g., the diacrylate or dimethacrylate of $$HOCH_2CH_2OCH_2CH_2OOCRCOOCH_2CH_2OCH_2CH_2OH$$

where R is a divalent hydrocarbon radical, e.g., methylene or ethylene. Other useful vinyl monomers include glycerol triacrylate, 1,2,4-butanetriol trimethacrylate and pentaerythritol tetramethacrylate.

An addition polymerization initiator activatable by actinic radiation and which is inactive thermally below 85° C. is added in amounts of from 0.001 to 10 parts by weight, preferably 0.001 to 0.2 part by weight. Examples of initiators inactive thermally at 85° C. and below which are non-gaseous at normal pressure are alpha-ketaldonyl alcohols such as benzoin, pivaloin, etc., acyloin ethers such as benzoin methyl or ethyl ethers, alphahydrocarbon-substituted aromatic acyloins including α-methylbenzoin, α-allylbenzoin and α-phenylbenzoin and their substitution products. In addition, benzophenone and uranyl nitrate are also useful. Preferably, however, the photoinitiators are thermally inactive below 185° C. The anthraquinone photoinitiators fall within this range. In addition to anthraquinone other suitable initiators include 9,10-anthraquinone, 1-chloroanthraquinone, 2-chloroanthraquinone, 2-methylanthraquinone, 2-tert - butylanthraquinone, octamethylanthraquinone, 1,4-naphthoquinone, 1,2-benzanthraquinone, 2-3-benzanthraquinone, 2-methyl-1,4-naphthoquinone, 2,3-dichloronaphthoquinone, 1,4 - dimethylanthraquinone, 2,3 - dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4-tetrahydrobenz[a]anthracene-7,12-dione.

A thermal addition polymerization inhibitor is present in the preferred composition. Suitable thermal polymerization inhibitors that can be used in addition to the preferred p-methoxyphenol include hydroquinone and alkyl and aryl-substituted hydroquinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene. Other useful inhibitors include p-toluquinone and chloranil, and thiazine dyes, e.g., Thionine Blue G (C.I. 52025), Methylene Blue B (C.I. 52015) and Toluidine Blue O (C.I. 52040).

Stannous salts soluble in the photopolymerizable mixture, in addition to the preferred stannous chloride dihydrate, include $Sn(BF4)_2$, the stannous octoate, oleate, laurate and palmitate. The amount of stannous salt added to the photopolymerizable compositions ranges from 0.3 to 3 parts by weight. If more than 3 parts by weight is used thermal polymerization may occur during element manufacture. If the stannous salts are completely soluble in the photopolymerizable compositions good results are obtained. When, however, the salts are insoluble or are only partially soluble, in some cases, e.g., with stannous laurate and palmitate, there is less improvement in the rate of polymerization of an air saturated element.

The novel photopolymerizable compositions are useful in the preparation of photopolymerizable printing elements comprising an adherent support having superposed thereon a solid layer of the just described photopolymerizable composition from 0.1 to 250 mils in thickness. The thickness of the photopolymerizable layer varies according to the use.

The base or support for the photopolymerizable elements of this invention are preferably flexible and composed of metal, e.g., aluminum or steel, but they can be rigid. They also can be made of various film-forming resins or polymers. Suitable supports are disclosed in U.S. Patent 2,760,863, col. 5, lines 14 to 33. Various anchor layers, as disclosed in this patent, may be used to give strong adherence between the base and the photopolymerizable layer. The adhesive compositions disclosed in assignee's U.S. application of Burg, Serial No. 750,868, filed July 25, 1958 (U.S. Patent 3,036,913) are also very effective.

An antihalation material can be present in the support, or in a layer or stratum on the surface of the support, or can be contained in the anchor layer. With transparent or translucent supports, the antihalation material may be on the rear surface of the element. When antihalation material is used it preferably should be sufficiently absorptive of actinic light to permit reflectance from the support or combined support of no more than 35% of incident actinic light.

To form the printing plate, the printing element is exposed to actinic light through a process transparency, e.g., a process negative or positive (an image-bearing transparency consisting solely of substantially opaque and substantially transparent areas where the opaque areas are substantially of the same optical density, the so-called line or halftone negative or positive).

The photopolymerizable elements may be exposed to actinic light from any source and of any type. The light source should, however, furnish an effective amount of ultraviolet radiation, since free-radical-generating addition-polymerization initiators activatable by actinic light generally exhibit their maximum sensitivity in this range. Suitable sources include carbon arcs, mercury-vapor arcs, fluorescent lamps with special ultraviolet-light-emitting phosphors, argon glow lamps, and photographic flood lamps. Of these, the mercury-vapor arcs, particularly the sunlamp type type, and the fluorescent sunlamps, are most suitable. The sunlamp mercury-vapor arcs are customarily used at a distance of one and one-half to ten inches from the photopolymerizable layers.

The unexposed areas of the preferred photopolymerized element described herein are removed by means of an aqueous solution. Suitable aqueous solutions include preferably alkali metal hydroxides, e.g., sodium and potassium, and in addition, ammonium, ammonium substituted hydroxides and the basic reacting salts of the alkali metal hydroxides, especially those of weak acids, e.g., the carbonates, bicarbonates and acetates. Generally the base will be present in concentrations ranging from about 0.01 to about 10 percent, although normally solutions greater than about 5 percent will not be used. The washout solution may be applied in any conventional manner, as by pouring, immersing, brushing or spraying in removing the unpolymerized areas. Suitable solvents for the other photopolymerizable compositions which are useful in the present invention can be found in their respective patents or applications.

The photopolymerizable elements described herein are useful in the preparation of printing relief elements which yield good quality relief images after being exposed to or stored in air for up to 3 months. The printing reliefs made in accordance with this invention can be used in all classes of printing, but are particularly useful in those classes of printing wherein a distinct difference of height between printing and non-printing areas is required. These classes include those wherein the ink is carried by the raised portion of the relief such as in dry-offset printing, ordinary letterpress printing, the latter requiring greater height differences between printing and non-printing areas, and those wherein the ink is carried by the recessed portions of the relief such as in intaglio printing, e.g., line and inverted halftone. The plates are useful for multi-color printing. In addition, the photopolymerizable compositions are useful as binders for television phosphors, in producing ornamental effects and plastic articles of various types, for making multicolor television screens by photopolymerization procedures, in the preparation of photoresists for etching, gravure, etc.; planographic plates, matrices for printing mattes and as stencils. Other uses for the composition include patterns for automatic engraving machines, foundry molds, cutting and stamping dyes, name stamps, relief maps, for braille; as rapid cure coatings, e.g., on film base, inside tanks; as variable area and variable density sound tracks on film; for embossing plastics, paper, etc., e.g., with a die prepared from said photopolymerizable compositions; and in the preparation of printed circuits.

Photopolymerizable elements prepared from photopolymerizable compositions comprising the above-described stannous salts are not desensitized upon exposure to the oxygen in the air for up to three months. Because no inhibition by oxygen occurs in the elements during this period, no conditioning treatment, e.g., by treating in an inert atmosphere, etc. is required.

In addition to the above advantages, it was found unexpectedly that an increase in polymerization rate in air was noted after the stannous salts were added to ethylenically unsaturated monomer-photoinitiator systems. By way of illustration, a photopolymerizable composition containing anthraquinne polymerizes in air in about 240 seconds. When stannous chloride dihydrate (1% by weight) replaces the anthraquinone, the polymerization occurs in 35 seconds. When both anthraquinone and stannous chloride dihydrate, however, are present the rate of polymerization is reduced to 10 seconds (see Example II above). Still further advantages will be apparent from the above description.

I claim:

1. A photopolymerizable composition comprising (1) 10 to 60 parts by weight of a normally non-gaseous, ethyleniclaly unsaturated compound, containing 1 to 4 terminal ethylenic groups, having a molecular weight less than 1500 and a boiling point above 100° C. at normal atmospheric pressure, and being capable of forming a high polymer by photoinitiated addition polymerization, (2) 0.001 to 10 parts by weight of an addition polymerization initiator activatable by actinic light and inactive thermally below 85° C. that is selected from the group consisting of benzoin, pivaloin; benzoin methyl and ethyl ether, alpha-hydrocarbon-substituted benzoins; benzophenone; uranyl nitrate and anthraquinones;

(3) 40 to 90 parts by weight of a compatible, coherent film-forming, macromolecular organic polymer having a molecular weight greater than 10,000, and (4) 0.3 to 3.0 parts by weight of a stannous salt of an acid.

2. A composition as defined in claim 1 wherein the stannous salt is soluble in the composition.

3. A composition as set forth in claim 1 wherein said initiator is inactive thermally below 185° C.

4. A composition as set forth in claim 1 containing (5) 0.001 to 2 parts by weight of an addition polymerization inhibitor.

5. A composition as set forth in claim 1 wherein said stannous salt is stannous chloride.

6. A photopolymerizable composition comprising (1) 10 to 60 parts by weight of a normally non-gaseous, ethylenically unsaturated compound, containing 1 to 4 terminal ethylenic groups, having a molecular weight less than 1400 and a boiling point above 100° C. at normal atmospheric pressure, and being capable of forming a high polymer by photoinitiated addition polymerization, (2) 0.001 to 10 parts by weight of an anthraquinone addition polymerization initiator activatable by actinic light and inactive thermally below 85° C.;

(3) 40 to 90 parts by weight of a compatible, coherent film-forming, macromolecular organic polymer having a molecular weight greater than 10,000, and (4) 0.3 to 3.0 parts by weight of a stannous salt of an acid.

7. A composition as set forth in claim 6 wherein said initiator is anthraquinone.

8. A photopolymerizable element comprising a support bearing a solid photopolymerizable layer comprising (1) 10 to 60 parts by weight of a normally non-gaseous, ethylenically unsaturated compound, containing 1 to 4 terminal ethylenic groups, having a molecular weight less than 1400 and a boiling point above 100° C. at normal atmospheric pressure, and being capable of forming a high polymer by photoinitiated addition polymerization, (2) 0.001 to 10 parts by weight of an addition polymerization initiator activatable by actinic light and inactive thermally below 85° C. that is selected from the group consisting of benzoin, pivaloin; benzoin methyl and ethyl ether, alpha-hydrocarbon-substituted benzoins; benzophenone; uranyl nitrate and anthraquinones;

(3) 40 to 90 parts by weight of a compatible, coherent film-forming, macromolecular organic polymer having a molecular weight greater than 10,000, and (4) 0.03 to 3.0 parts by weight of a stannous salt of an acid.

9. An element as set forth in claim 8 wherein said stannous salt is soluble in the composition of the layer.

10. A photopolymerizable element as set forth in claim 8 having an antihalation material disposed in light-absorbing relationship with the relief height-forming stratum of the photopolymerizable layer.

11. An element as defined in claim 8 wherein said initiator is inactive thermally below 185° C.

12. An element as set forth in claim 8 containing (5) 0.001 to 2 parts by weight of an addition polymerization inhibitor.

13. A photopolymerizable element comprising a metal support bearing, in order, an antihalation layer, a solid photopolymerizable layer comprising (1) 10 to 60 parts by weight of a normally non-gaseous, ethylenically unsaturated compound, containing 1 to 4 terminal ethylenic groups, having a molecular weight less than 1500 and a boiling point above 100°

C. at normal atmospheric pressure, and being capable of forming a high polymer by photoinitiated addition polymerization, (2) 0.001 to 10 parts by weight of an addition polymerization initiator activatable by actinic light and inactive thermally below 85° C. that is selected from the group consisting of benzoin, pivaloin; benzoin methyl and ethyl ether, alpha-hydrocarbon-substituted benzoins; benzophenone; uranyl nitrate and anthraquinones;

(3) 40 to 90 parts by weight of a compatible, coherent film-forming, macromolecular organic polymer having a molecular weight greater than 10,000, and (4) 0.3 to 3.0 parts by weight of a stannous salt of an acid.

14. A photopolymerizable element comprising a support bearing a solid photopolymerizable layer comprising (1) 10 to 60 parts by weight of a normally non-gaseous, ethylenically unsaturated compound, containing 1 to 4 terminal ethylenic groups, having a molecular weight less than 1400 and a boiling point above 100° C. at normal atmospheric pressure, and being capable of forming a high polymer by photoinitiated addition polymerization, (2) 0.001 to 10 parts by weight of an anthraquinone addition polymerization initiator activatable by actinic light and inactive thermally below 85° C.;

(3) 40 to 90 parts by weight of a compatible, coherent film-forming, macromolecular organic polymer having a molecular weight greater than 10,000, and (4) 0.3 to 3.0 parts by weight of a stannous salt of an acid.

15. An element as set forth in claim 14 wherein said initiator is anthraquinone.

References Cited by the Examiner

UNITED STATES PATENTS

| | | | |
|---|---|---|---|
| 2,760,863 | 8/56 | Plambeck. | |
| 2,791,504 | 5/57 | Plambeck. | |
| 2,880,152 | 3/59 | Hiltz et al. | 96—115 XR |
| 2,880,153 | 3/59 | Hiltz et al. | 96—115 |
| 2,892,716 | 6/59 | Martin | 96—115 |
| 2,893,868 | 7/59 | Barney | 96—115 |
| 2,902,365 | 9/59 | Martin | 96—115 XR |
| 2,948,611 | 8/60 | Barney | 96—115 |
| 2,951,758 | 9/60 | Notley | 96—115 |
| 2,972,540 | 2/61 | Saner et al. | 96—115 |
| 3,036,915 | 5/62 | Notley | 96—115 |
| 3,036,916 | 5/62 | Notley | 96—115 |

OTHER REFERENCES

Oster: "Dye Sensitized Photopolymerization," Nature, vol. 173, Feb. 13, 1954, page 300.

NORMAN G. TORCHIN, *Primary Examiner.*

PHILIP E. MANGAN, LOUISE P. QUAST, *Examiners.*